(12) United States Patent
Watanabe et al.

(10) Patent No.: US 9,716,496 B2
(45) Date of Patent: Jul. 25, 2017

(54) NON-CONTACT SWITCH DEVICE

(71) Applicant: Panasonic Corporation, Osaka (JP)

(72) Inventors: Kazuhiro Watanabe, Osaka (JP); Kouichi Ishino, Fukuoka (JP); Takeshi Nakayama, Hyogo (JP); Masahiro Ishii, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 408 days.

(21) Appl. No.: 14/371,267

(22) PCT Filed: Nov. 1, 2013

(86) PCT No.: PCT/JP2013/006489
§ 371 (c)(1),
(2) Date: Jul. 9, 2014

(87) PCT Pub. No.: WO2014/080578
PCT Pub. Date: May 30, 2014

(65) Prior Publication Data
US 2014/0354070 A1 Dec. 4, 2014

(30) Foreign Application Priority Data
Nov. 21, 2012 (JP) .................................. 2012-255239

(51) Int. Cl.
*H03K 17/965* (2006.01)
*H03K 17/95* (2006.01)
(Continued)

(52) U.S. Cl.
CPC ............. *H03K 17/965* (2013.01); *G01B 7/14* (2013.01); *H01F 38/14* (2013.01);
(Continued)

(58) Field of Classification Search
None
See application file for complete search history.

(56) References Cited

U.S. PATENT DOCUMENTS 4,425,511 A * 1/1984 Brosh .................... H03K 17/97
307/106

FOREIGN PATENT DOCUMENTS

JP    05-075012    10/1993
JP    2000-311541    11/2000
(Continued)

OTHER PUBLICATIONS

International Search Report issued Feb. 4, 2014 in International (PCT) Application No. PCT/JP2013/006489.

*Primary Examiner* — Rexford Barnie
*Assistant Examiner* — Swarna N Chowdhuri
(74) *Attorney, Agent, or Firm* — Wenderoth, Lind & Ponack, L.L.P.

(57) ABSTRACT

The present disclosure aims to provide a high-durability switch device. The switch device includes: a switch key top and a switch key bottom that are freely displaceable relative to each other, the switch key top including key top reception and transmitting coils that are connected to each other, and the switch key bottom including: a key bottom transmitting coil having a relative positional relationship with the key top receiving coil that changes according to a relative displacement operation with respect to the switch key top; a key bottom receiving coil having a relative positional relationship with the key top transmitting coil that changes according to the relative displacement operation with respect to the switch key top; a current supplier supplying current to the key bottom transmitting coil; and a determiner determining relative displacement with respect to the switch key top from induced current in the key bottom receiving coil.

9 Claims, 12 Drawing Sheets

(51) Int. Cl.
*H03K 17/97* (2006.01)
*G01B 7/14* (2006.01)
*H01F 38/14* (2006.01)
*H03M 1/12* (2006.01)

(52) U.S. Cl.
CPC ......... *H03K 17/9525* (2013.01); *H03K 17/97* (2013.01); *H03M 1/12* (2013.01); *H01H 2239/024* (2013.01); *H03K 2217/94057* (2013.01); *H03K 2217/94068* (2013.01)

(56) References Cited

FOREIGN PATENT DOCUMENTS

| | | |
|---|---|---|
| JP | 2001-325066 | 11/2001 |
| JP | 2004-087250 | 3/2004 |
| JP | 2005-100917 | 4/2005 |
| JP | 2009-245723 | 10/2009 |
| JP | 2010-192410 | 9/2010 |
| JP | 2012-049950 | 3/2012 |
| JP | 2012049950 A * | 3/2012 |

* cited by examiner

FIG. 3A
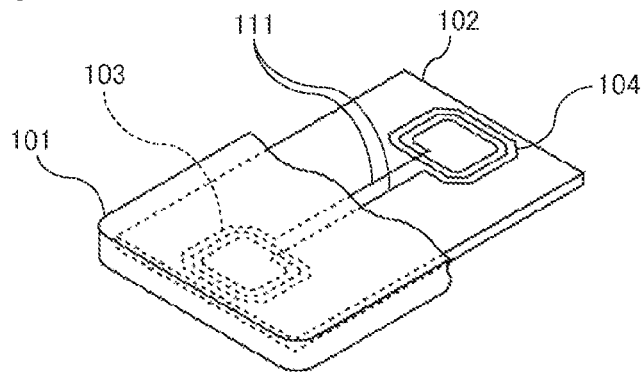
FIG. 3B
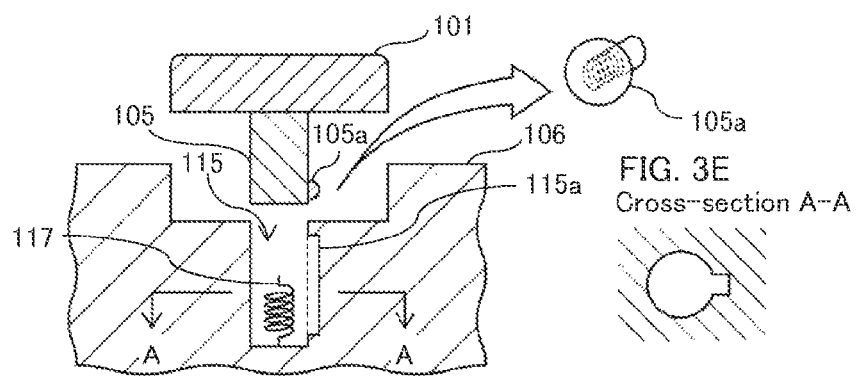
FIG. 3E
Cross-section A-A
FIG. 3C
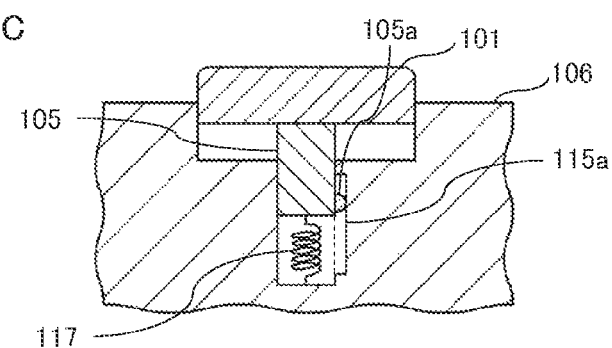
FIG. 3D
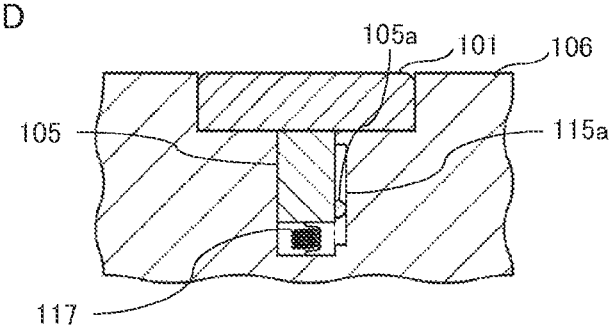

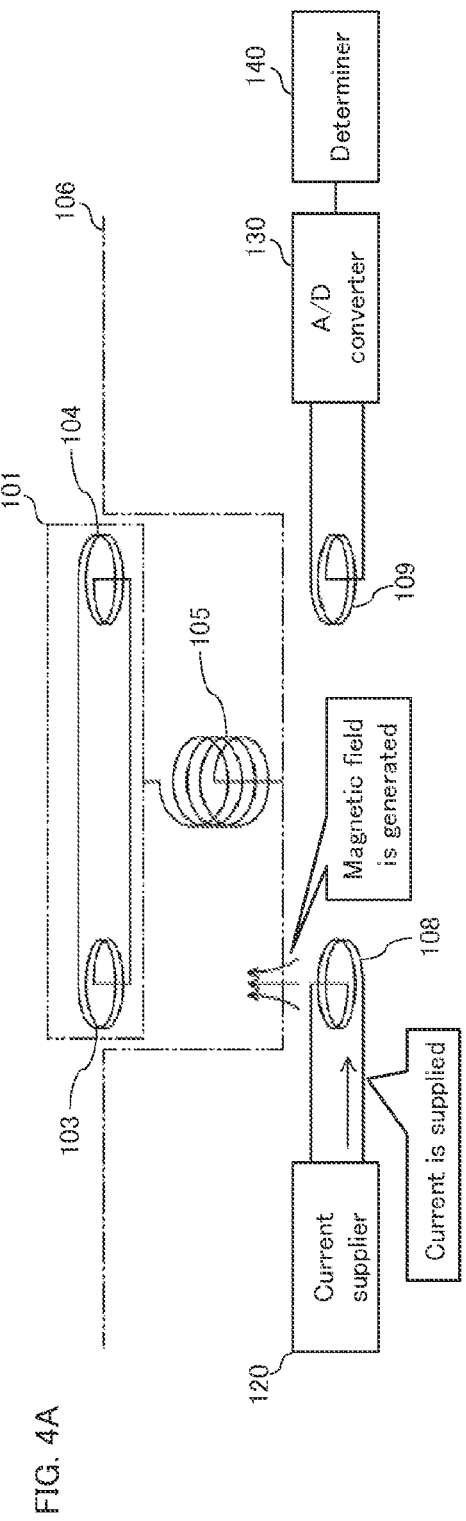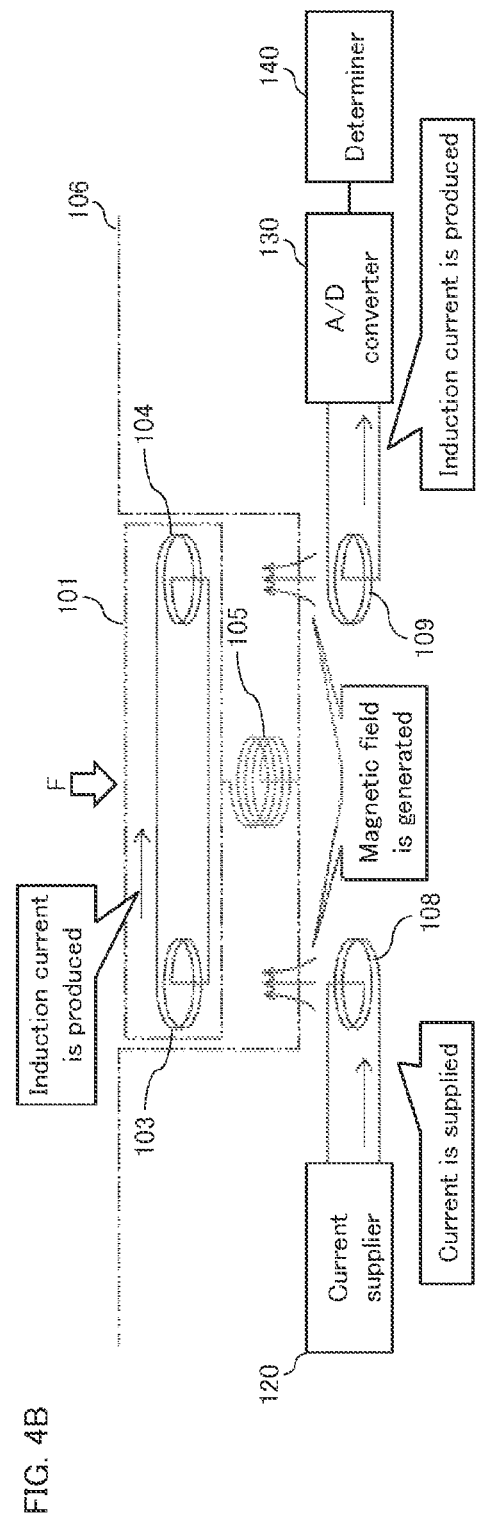

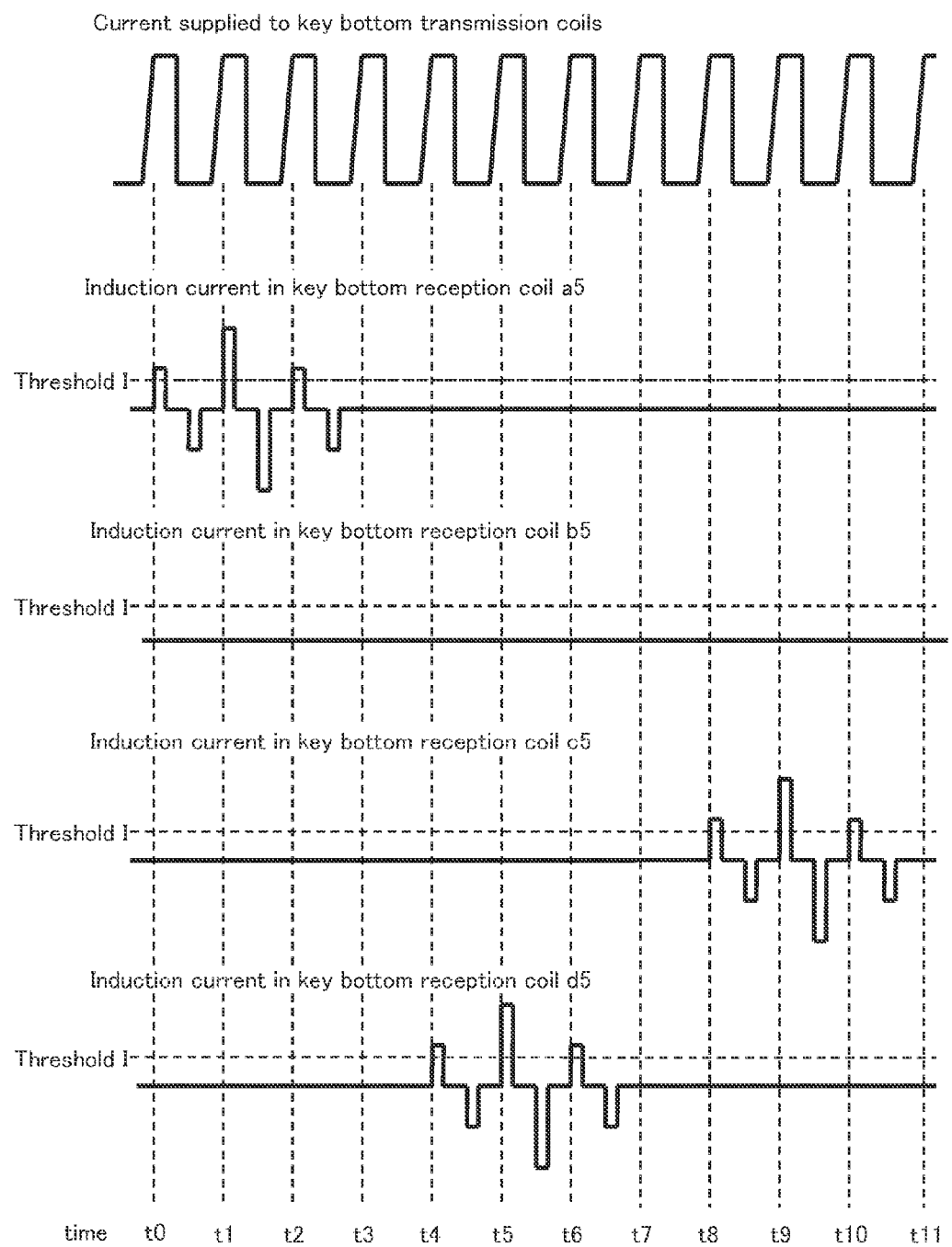

FIG. 12
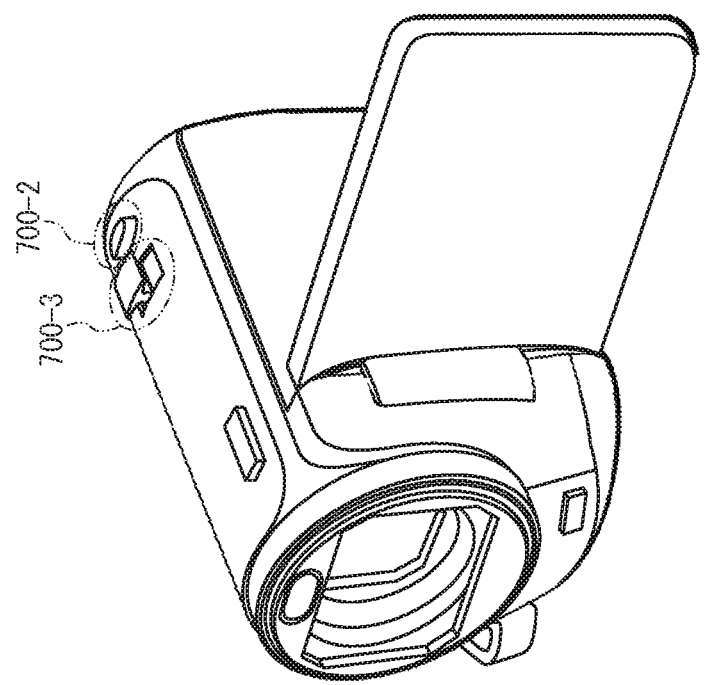
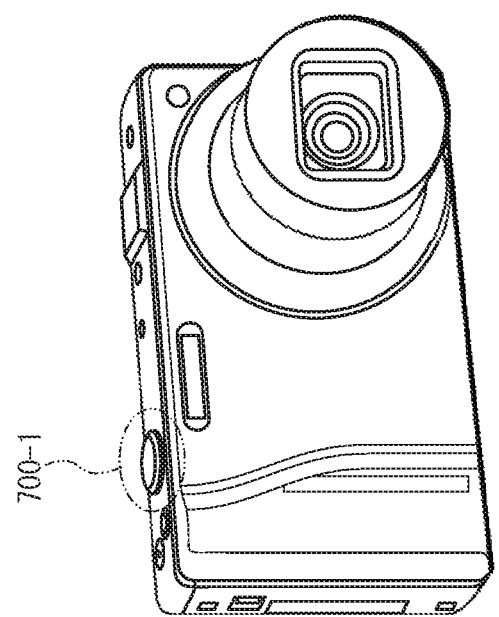

NON-CONTACT SWITCH DEVICE

TECHNICAL FIELD

The present disclosure pertains to a switch device, and particularly pertains to a key top and key bottom in a switch device where the two components can freely move relative to each other.

BACKGROUND ART

This type of switch device is described in Patent Literature 1, which discloses a conventional example. Such a switch device includes coils provided on each of a switch key top and a switch key bottom. When the switch key top is pressed, a phase of induced current is detected upon production in a coil of the switch key bottom, enabling a switch key top pressing determination to be performed. This type of switch device has merits seen in switch devices that use physical contact, such as the absence of incomplete contact due to contact pin friction or waste adhesion.

CITATION LIST

Patent Literature

Patent Literature 1

Japanese Patent Application Publication No. 2000-311541

SUMMARY OF INVENTION

However, the switch device of Patent Literature 1 has wiring connecting a coil of the switch key top to a current supplier. As such, this wiring is worn down over the course of repeated pressing on the switch key top, and may lead to problems in that pressing determination of the switch key top is made inappropriately.

In consideration of the above-described problem, the present disclosure seeks to provide a switch device having high durability.

A switch device of the present disclosure comprises: a switch key top and a switch key bottom that are freely displaceable relative to each other, wherein the switch key top includes a key top receiving coil and a key top transmitting coil that are connected to each other, and the switch key bottom includes: a key bottom transmitting coil having a relative positional relationship with the key top receiving coil that changes according to a relative displacement operation with respect to the switch key top; a key bottom receiving coil having a relative positional relationship with the key top transmitting coil that changes according to the relative displacement operation with respect to the switch key top; a current supplier supplying current to the key bottom transmitting coil; and a determiner determining a relative displacement with respect to the switch key top, according to an induced current occurring in the key bottom receiving coil.

The switch device of the present disclosure enables an increase in durability by determining a relative displacement operation state of a switch key top using the effect of electromagnetic induction without requiring wiring that imposes a load according to the relative displacement between a switch key top and a switch key bottom.

BRIEF DESCRIPTION OF EMBODIMENTS

FIGS. 3A-3E illustrate the configuration of the switch device 100 pertaining to Embodiment 1.

FIGS. 4A and 4B are schematic diagram of the operations of the switch device 100 pertaining to Embodiment 1.

FIG. 10 shows an example of induced current occurring in a key bottom receiving coil over time, pertaining to Embodiment 3.

FIG. 12 illustrates an implementation example of the switch device.

DESCRIPTION OF EMBODIMENTS (Progress Leading to Invention)

In a terminal, such as a mobile telephone using switches with a high usage frequency, damage to the switch device often produces a need to exchange or repair the terminal. Thus, a switch device having high durability is desired.

In a typical switch device, physical contact between a switch key top and a switch key bottom is detected to perform a switch key top pressing detection. Such a switch device poses a problem in that insufficient contact may occur over the course of repeated use, as contact pins are subject to friction and waste adhesion.

Figure 11A:
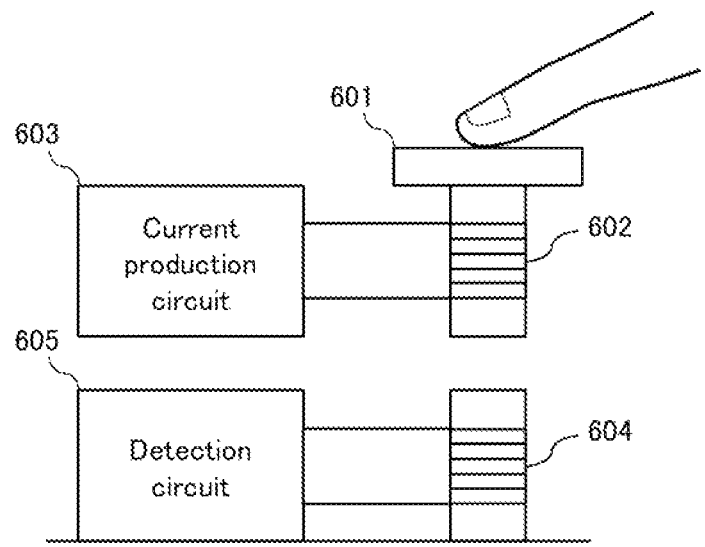
FIGS. 11A and 11B are overall schematic diagrams of a switch device pertaining to Patent Literature 1.
Figure 11B:
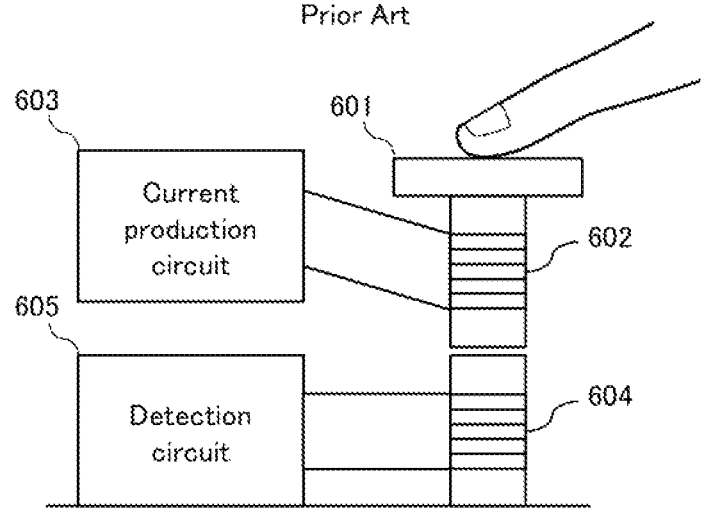

Moreover, the switch device of Patent Literature 1 (see FIGS. 11A and 11B) performs a pressing detection on a switch key top 601, which is equipped with a coil A 602, by having a detection circuit 605 detect a phase of induced current produced in a coil B 604 when the switch key top 601 is pressed. The switch device of Patent Literature 1 does not use the physical contact with the switch key top for detection, and thus prevents incomplete contact from occurring due to the aforementioned issues of contact pin friction and waste adhesion.

Nevertheless, the switch device of Patent Literature 1 uses wiring to connect the coil A 602 to a current production circuit 603 supplying electric current. As such, this wiring is worn down over the course of repeated pressing on the switch key top 601, and may lead to problems in that pressing determination of the switch key top 601 is made inappropriately.

In consideration of the above, the inventors have arrived at the switch device of the present disclosure, by discovering that the effect of induced current is usable for making the switch key top pressing detection, and does not require wiring imposing a load according to relative displacement of the switch key top and the switch key bottom.

Embodiments of the present disclosure are described below, with reference to the accompanying figures.

1. Embodiment 1

Figure 1:
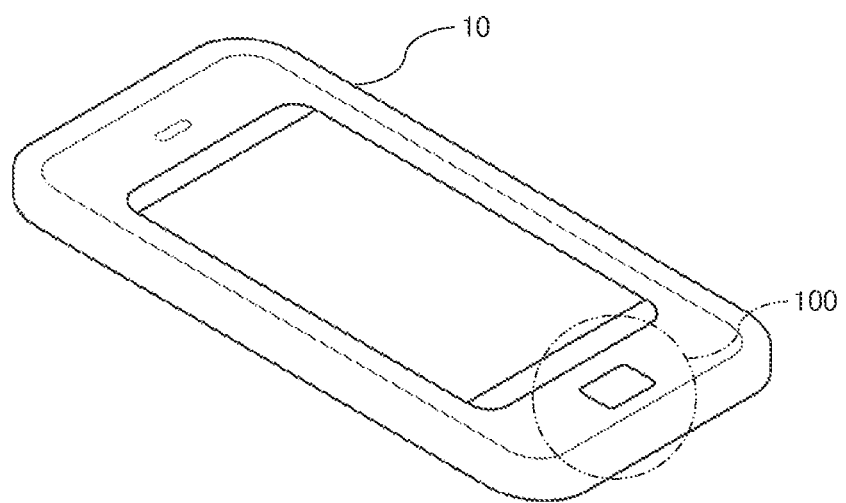
FIG. 1 illustrates a switch device 100 as installed according to Embodiment 1.

A switch device 100 pertaining to Embodiment 1 is, for example, installed on a mobile terminal 10 as shown in FIG. 1.

Figure 2:
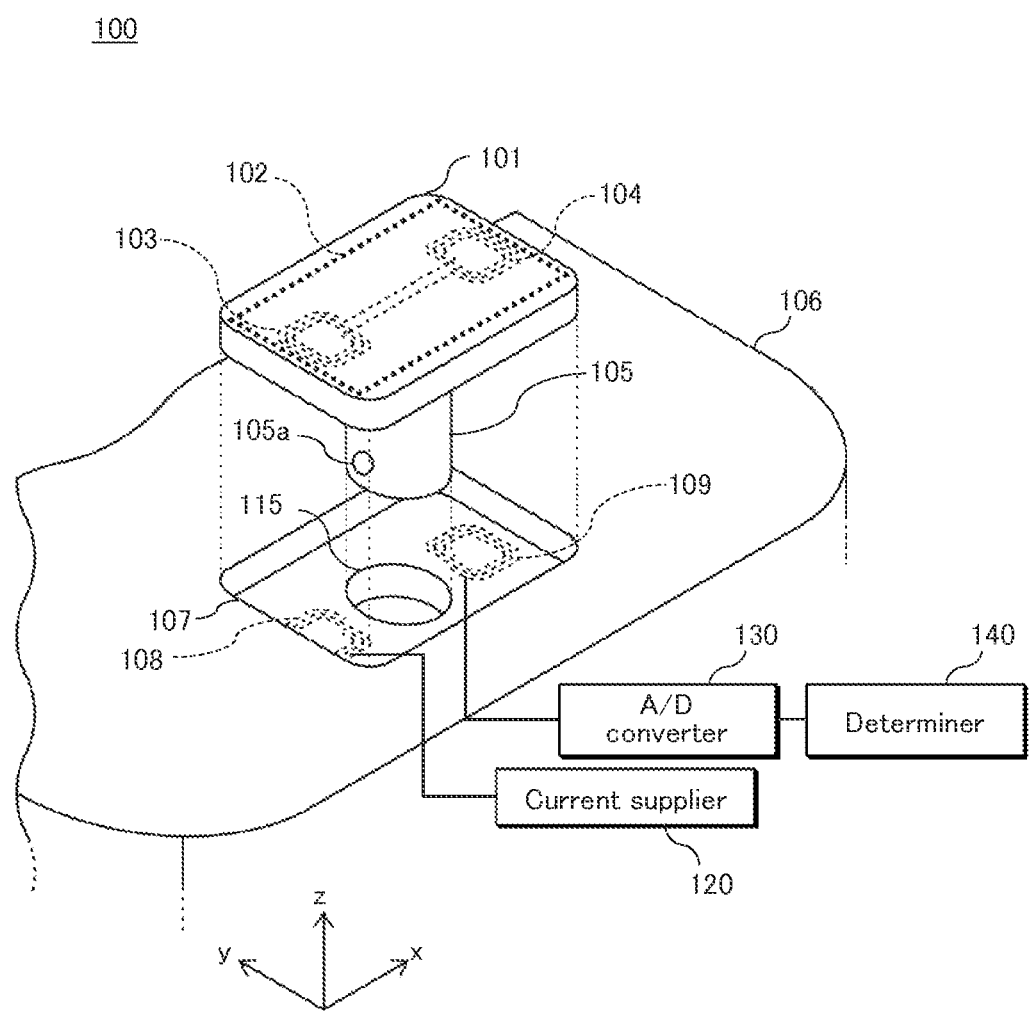
FIG. 2 is an overall schematic diagram of the switch device 100 pertaining to Embodiment 1.

FIG. 2 is a schematic diagram of the switch device 100.

The switch device 100 includes a switch key top 101 and a switch key bottom 106.

[Switch Key Top 101 Configuration]

The switch key top 101 is a flat, rectangular plate as large as a human index finger that includes a key top receiving coil 103 and a key top transmitting coil 104. As shown in FIG. 2, the two coils are provided with a degree of mutual separation.

The switch key top 101 is, for example, made of a moulded insulating resin.

The key top receiving coil 103 and the key top transmitting coil 104 are spiral coils. As shown in FIG. 3A, the spiral coils are formed by printing on a substrate 102. The key top receiving coil 103 and the key top transmitting coil 104 are connected to each other by a connection pattern 111.

The switch key top 101 has a bottom face with an axial rod 105 protruding from the centre thereof. The axial rod 105 is inserted into a hole 115 of the later-described switch key bottom 106 so as to slide freely.

[Switch Key Bottom 106 Configuration]

As shown in FIG. 2, the switch key bottom 106 is a switch base that is part of or is provided on the mobile terminal 10, and has a concavity 107 in a top face thereof for accommodating the switch key top 101.

The concavity 107 has the hole 115 formed therein for passing the axial rod 105 of the switch key top 101.

As shown in FIG. 3B, the hole 115 has a coil spring 117 arranged therein. A key groove 115a is formed vertically in a part of the circumferential wall of the hole 115. A ball-shaped protrusion 105a is formed on a circumferential wall of the axial rod 105 of the switch key top 101, in correspondence with the key groove 115a.

The ball-shaped protrusion 105a fits into the key groove 115a when the switch key top 101 is pressed. Thus, the ball-shaped protrusion 105a serves as a guide within the key groove 115a and prevents the switch key top 101 from rotating irregularly.

As shown by the plane-view diagram indicated by the arrow in FIG. 3B, the ball-shaped protrusion 105a has elastic bias applied thereto by the coil spring 117 under the axial rod 105. Also, the key groove 115a is shaped to make the top of the hole 115 unreachable. That is, the key groove 115a is not formed at the top of the hole 115.

The ball-shaped protrusion 105a is set up to receive elastic bias so that, when the switch key top 101 and switch key bottom 106 are assembled, the ball-shaped protrusion 105a retreats within the axial rod 105 to allow insertion into the hole 115. However, after assembly, the ball-shaped protrusion 105a protrudes into the key groove 115a and prevents easy removal from the hole 115.

FIG. 3C illustrates the positional relationship of the switch key top 101 and the switch key bottom 106 when the switch key top 101 is not being pressed. FIG. 3D illustrates the positional relationship of the switch key top 101 and the switch key bottom 106 when the switch key top 101 is pressed to maximum depth.

The explanation now proceeds with continued reference to FIG. 2.

The bottom face of the concavity 107 in the switch key bottom 106 is provided with a key bottom transmitting coil 108 and a key bottom receiving coil 109, respectively corresponding to the key top receiving coil 103 and the key top transmitting coil 104 of the switch key top 101.

The key bottom transmitting coil 108 is connected to a current supplier 120 of the switch key bottom 106 and the key bottom receiving coil 109 is connected to an A/D converter 130 of the switch key bottom 106.

The current supplier 120 uses a phase-locked loop (hereinafter, PLL) or the like to generate alternating current at a predetermined frequency, and supplies the alternating current to the key bottom transmitting coil 108.

The A/D converter 130 converts an induced current, induced in the key bottom receiving coil 109 by magnetic induction, into a digital value.

A determiner 140 determines the state of the switch key top 101 by comparing the digital value obtained from the A/D converter 130 to threshold I and threshold II, serving as references for press determination.

In the drawings, the current supplier 120, the A/D converter 130, and the determiner 140 are provided on the switch key bottom 106. However, these components may also be incorporated into a semiconductor integrated circuit within the mobile terminal 10.

[Operations]

FIGS. 4A and 4B are schematic diagrams of the operations of the switch device 100.

First, the current supplier 120 supplies current to the key bottom transmitting coil 108, thereby producing a magnetic field in the key bottom transmitting coil 108.

When the switch key top 101 is not pressed (see FIG. 4A), the key top receiving coil 103 and the key top transmitting coil 104 are not displaced toward the key bottom transmitting coil 108 and the key bottom receiving coil 109, such that no induced current is produced.

However, when the switch key top 101 is pressed (see FIG. 4B), the key top receiving coil 103 and the key top transmitting coil 104 are respectively displaced toward the key bottom transmitting coil 108 and the key bottom receiving coil 109, producing an induced current.

Specifically, the more the pressing of the switch key top 101 changes the positional relationship between the key top receiving coil 103 and the key bottom transmitting coil 108, the greater the change in the flux interlinking the key top receiving coil 103 and the key bottom transmitting coil 108, and the greater the induced current produced in the key top receiving coil 103. The key top receiving coil 103 and the key bottom transmitting coil 104 are connected at this time, such that the force of induction causes current flow in the key top transmitting coil 104. The magnetic field lines produced by the current are interlinked with the key bottom receiving coil 109 and produce an induced current therein. Current flow then reaches an input circuit of the A/D converter 130, which outputs a digital value in accordance with an analogue value.

The determiner 140 determines the state of the switch key top 101 by comparing the digital value obtained from the A/D converter 130 to threshold I and threshold II, serving as references for press determination.

Figure 5:
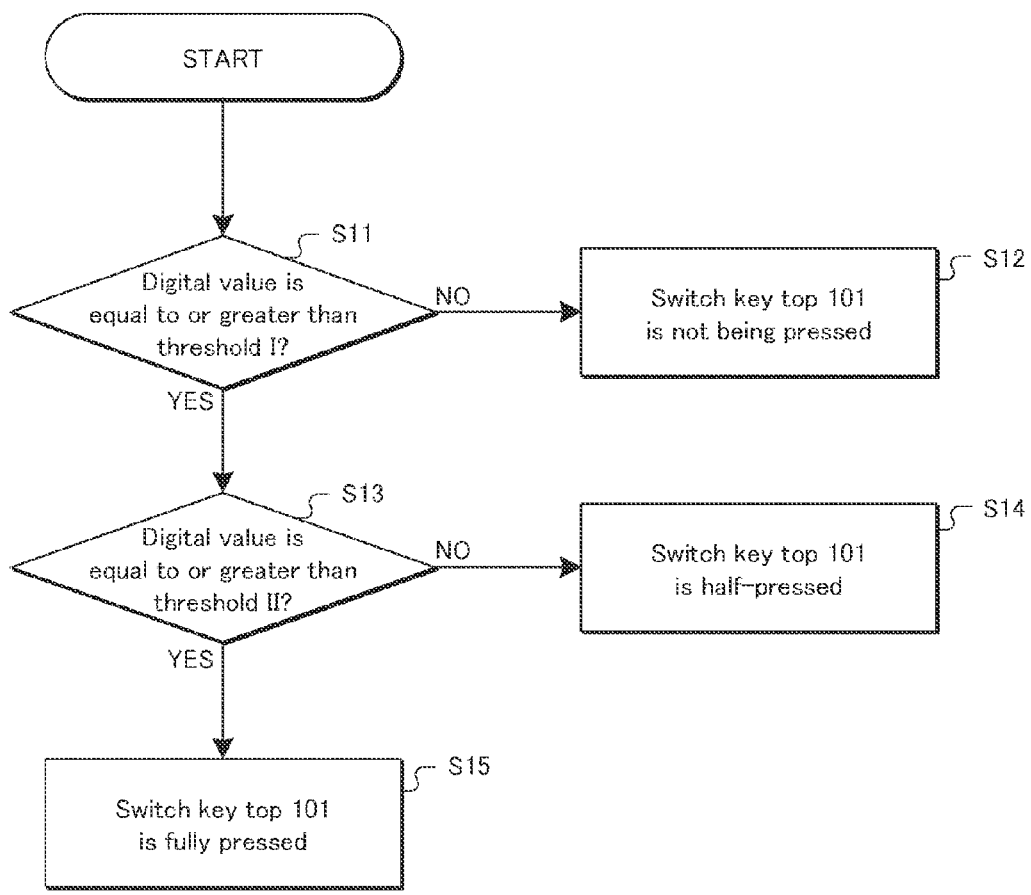
FIG. 5 is a flowchart of the operations of a determiner 140 pertaining to Embodiment 1.

FIG. 5 is a flowchart describing the operations of the determiner 140.

When the determiner 140 finds that the digital value from the A/D converter 130 is less than threshold I (NO in S11), the switch key top 101 is found not to be pressed (S12). When the digital value is greater than or equal to threshold I and lower than threshold II (YES in S11, NO in S13), the switch key top 101 is found to be half pressed (S14). When the digital value is greater than or equal to threshold II (YES in S11, YES in S13), the switch key top 101 is found to be fully pressed (S15).

[Example of Induced Current in Key Bottom Receiving Coil 109]

Figure 6:
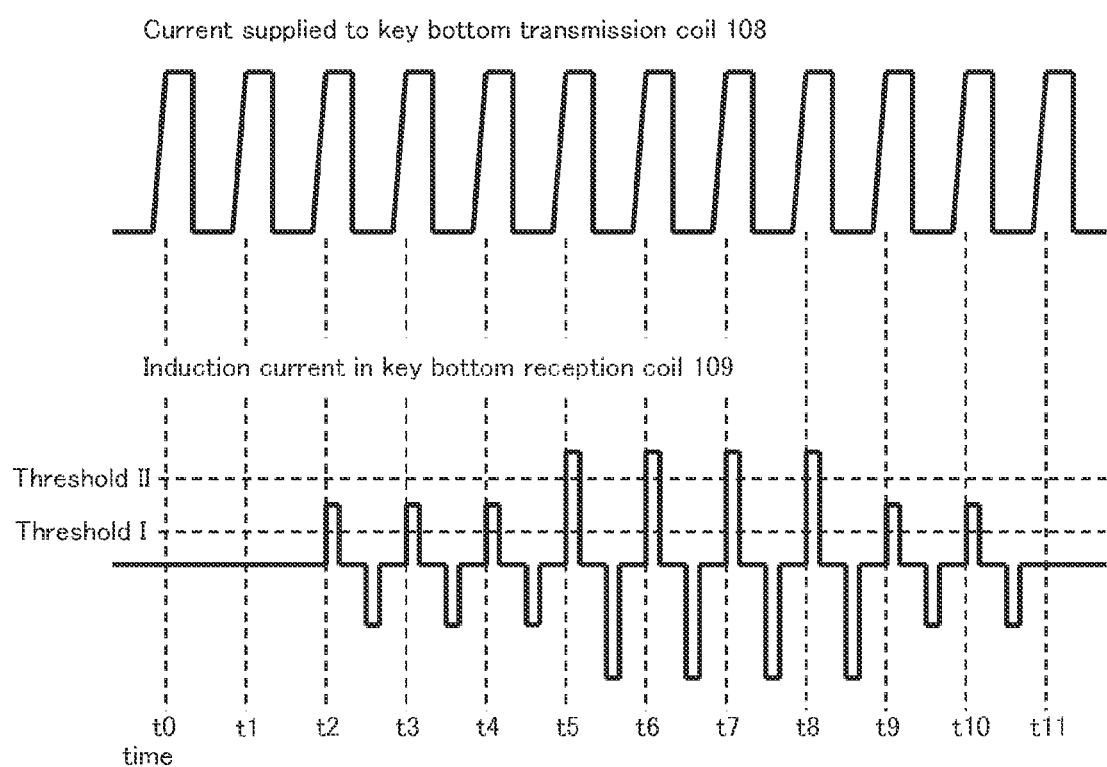
FIG. 6 shows an example of induced current occurring in a key bottom receiving coil 109 over time, pertaining to Embodiment 1.

FIG. 6 illustrates the induced current produced in the key bottom receiving coil 109 over time, in response to operation and non-operation of the switch key top 101.

From t0 to t2, there is no change in flux interlinking the transmitting coil and the receiving coil. As such, no induced current occurs in the key bottom receiving coil 109. Then, from t2 to t5, the flux interlinking the transmitting coil and the receiving coil varies, producing an induced current that is no less than threshold I and no more than threshold II. Also, from t5 to t9, the flux interlinking the transmitting coil and the receiving coil greatly varies, producing an induced current that exceeds threshold II.

[Supplement]

In the above-described Embodiment, the key bottom receiving coil 103 and the key bottom transmitting coil 104 must be separated to an extent sufficient for preventing cross-talk. However, the effect of cross-talk can be avoided by appropriately setting the thresholds used by the determiner 140 to compensate for a certain level of cross-talk.

Also, the current supplier 120 supplies periodically-varying current to the key bottom transmitting coil 108. Thus, the flux interlinking the transmitting coil and the receiving coil in response to the current varies even when the switch is not pressed, and may produce a slight induced current. However, this slight amount is not enough to prevent determination of pressing by the determiner 140.

2. Embodiment 2

Embodiment 1 describes a switch device determining pressing in one place. However, the switch device may also be configured as a switch device determining pressing in a plurality of places, such as on a directional pad. Embodiment 2 discloses a switch device determining pressing in a plurality of places.

(Configuration)

Figure 7:
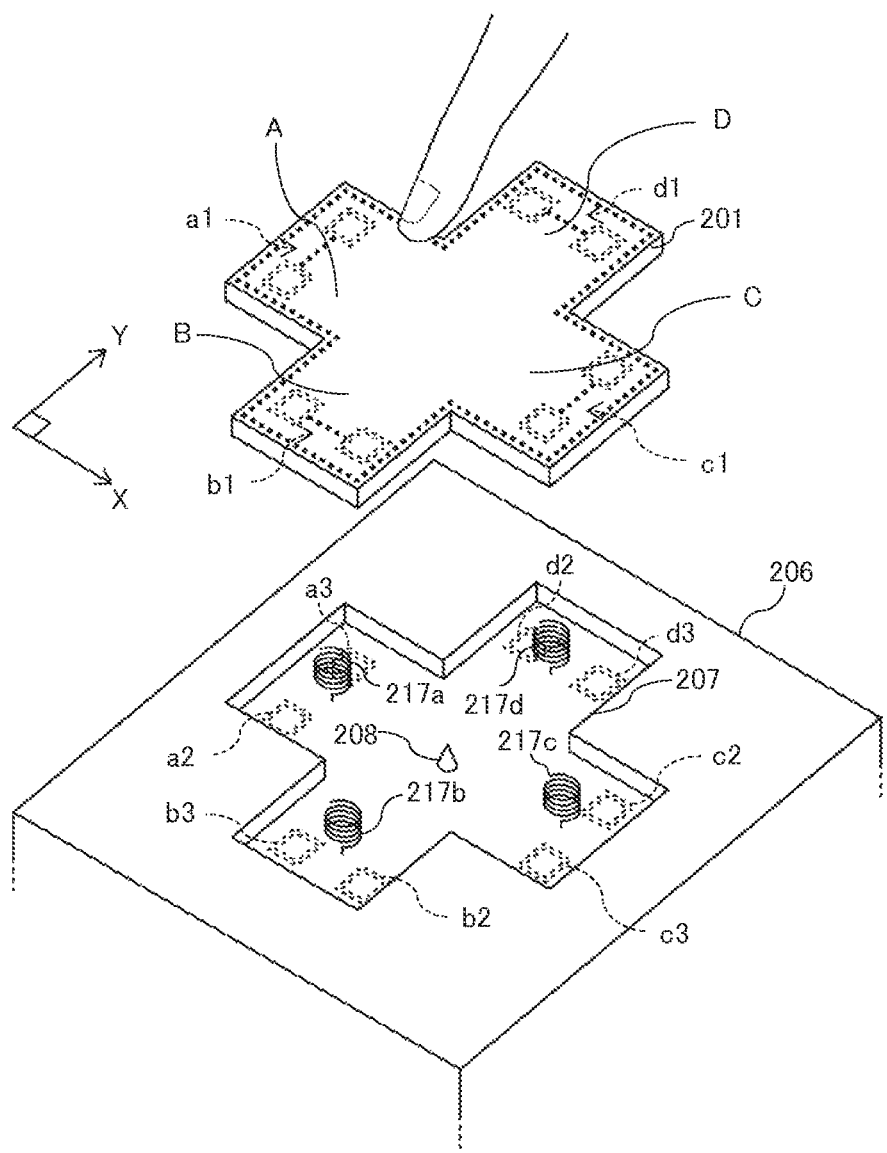
FIG. 7 is an overall schematic diagram of a switch device 200 pertaining to Embodiment 2.

FIG. 7 shows a switch device 200 pertaining to Embodiment 2. The switch device 200 includes a switch key top 201 and a switch key bottom 206.

The switch key top 201 is a directional pad having an X axis and a Y axis with ends A, B, C, and D. Each of the ends A, B, C, and D is configured identically to the switch key top of Embodiment 1. Coil patterns a1, b1, c1, and d1 are provided, and connect the key top transmitting coil and key top receiving coil at each of the ends.

The switch key bottom 206 is provided with a concavity 207 shaped to accommodate the switch key top 201. Also, coil springs 217a, 217b, 217c, and 217d are provided at predetermined positions of a bottom face of the concavity 207 in correspondence with the ends A, B, C, and D of the switch key top 201. The coil springs 217a, 217b, 217c, and 217d keep the switch key top 201 elevated above the bottom face of the concavity 207. In addition, a protrusion 208 is provided at the centre of the concavity 20, and is shaped as a cone. The protrusion 208 is in contact with the switch key top 201 such that when one of the ends A, B, C, or D of the switch key top 201 is pressed, the other ends are prevented from also being driven downward. Furthermore, the protrusion 209 is not required in cases where the ability to press all of the ends A, B, C, and D simultaneously to turn all switches ON is desired.

The bottom face of the concavity 207 of the switch key bottom 206 has key bottom transmitting coils a2, b2, c2, and d2 and key bottom receiving coils a3, b3, c3, and d3, provided in correspondence with the key top receiving coil and the key top transmitting coil of the ends A, B, C, and D of the switch key top 201.

The key bottom transmitting coils a2, b2, c2, and d2 are connected to the current supplier as described in Embodiment 1, and the key bottom receiving coils a3, b3, c3, and d3 are each separately connected to an A/D converter and a determiner as described in Embodiment 1.

Accordingly, the above-described switch device 200 has four determiners, each independently determining whether a corresponding end A, B, C, or D of the switch key top 201 is pressed, according to induced current in the respective key bottom receiving coils a3, b3, c3, and d3.

The operations of the switch device 200 pertaining to the pressing of the ends A, B, C, and D of the switch key top 201 are identical to the operations of the switch device 100 described in Embodiment 1 and the description thereof is thus omitted.

[Example of Determination by Switch Device 200]

Figure 8:
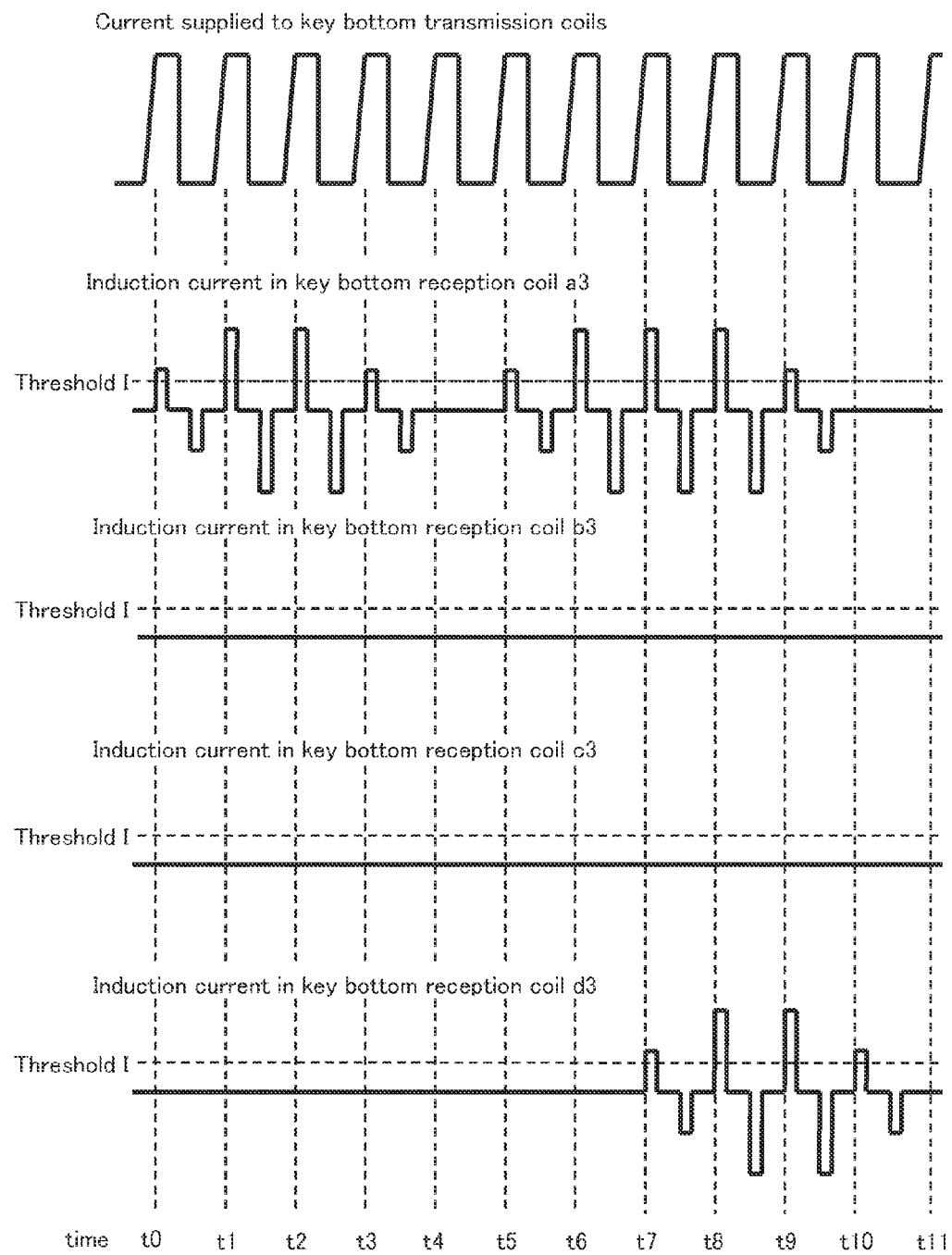
FIG. 8 shows an example of induced current occurring in a key bottom receiving coil over time, pertaining to Embodiment 2.

FIG. 8 illustrates the induced current produced in the key bottom receiving coils a3, b3, c3, and d3 over time, in response to the ends A, B, C, and D of the switch key top 201 being pressed.

In FIG. 8, from t0 to t4, induced current in key bottom receiving coil a3 has a digital value that is equal to or greater than threshold I. As such, a determination is made such that end A is being pressed. At the same time, the induced current in the other key bottom receiving coils b3, c3, and d3 has a digital value less than threshold I. A determination is thus made that ends B, C, and D are not being pressed. Also, from t7 to t10, the induced current in key bottom receiving coils a3 and d3 has a digital value that is greater than or equal to threshold I. Thus, a determination is made that ends A and D are being pressed simultaneously.

3. Embodiment 3

In Embodiments 1 and 2, the switch key top is operated by pressing. However, in Embodiment 3, the switch key top is operated by rotation. Rotation also causes a change in the distance between the switch key top coils and the switch key bottom coils, which produces an induced current and enables ON/OFF determination. The switch key top is simply rotated, which enables a special detection operation of detecting the rotation angle.

(Configuration)

Figure 9:
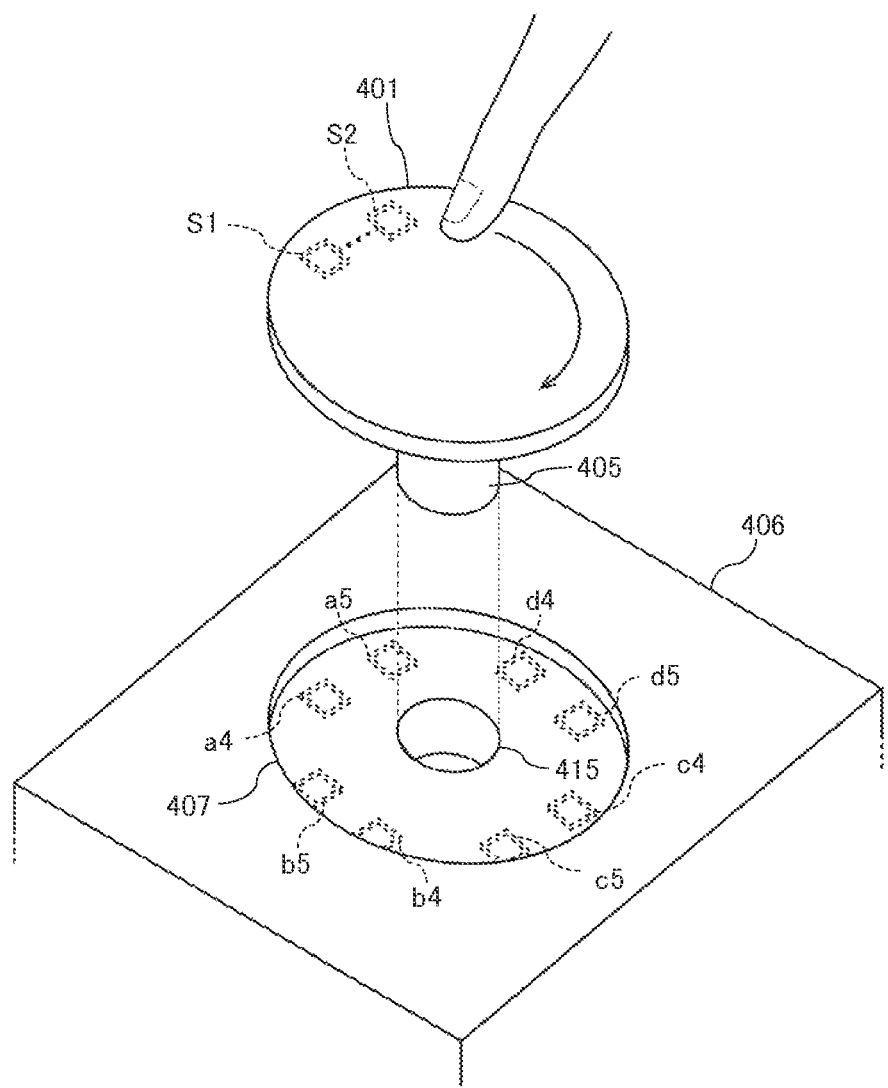
FIG. 9 is an overall schematic diagram of a switch device 400 pertaining to Embodiment 3.

FIG. 9 shows a switch device 400 pertaining to Embodiment 3. The switch device 200 includes a switch key top 401 and a switch key bottom 406.

The switch key top 401 has an axial rod 405 at the centre of a bottom face thereof. The axial rod 405 is inserted into an axial hole 415 so as to rotate freely. The axial hole 415 is formed in the centre of a bottom face of a concavity 407 in the switch key bottom 406. The rotational configuration is identical to that of a conventional rotary switch. The details thereof are thus omitted.

The switch key top 401 is configured identically to the switch key top of Embodiment, and has a pair of coil patterns respectively connected to a key top receiving coil s1 and a key top transmitting coil s2, which are provided at positions offset from the centre.

The switch key bottom 406 has key bottom transmitting coils a4, b4, c4, and d4 and key bottom receiving coils a5, b5, c5, and d5 arranged circumferentially at roughly 90-degree intervals and offset from the centre of the axial hole 415 so as to match the respective positions of the key top receiving coil s1 and the key top transmitting coil s2.

For each pair of key bottom transmitting coil and key bottom receiving coil, the positional relationship between the coils is identical to the position of the switch key top receiving coil s1 and the switch key top transmitting coil s2.

The key bottom transmitting coils a4, b4, c4, and d4 are connected to the current supplier as described in Embodiment 2, and the key bottom receiving coils a5, b5, c5, and d5 are separately connected to the A/D converter and to the determiner.

[Operations]

According to the above-described Embodiment of the switch device 400, when the switch key top 401 is rotated, the key top receiving coil s1 and the key top transmitting coil s2 approach one of the pairs of key bottom transmitting coil and key bottom receiving coil on the switch key bottom. This approach intensifies magnetic linkage and produces an induced current. A determination of the rotation position reached by the switch key top 401 is made according to the induced current produced in one of the key bottom receiving coils.

[Example of Determination by Switch Device 400]

FIG. 10 illustrates the induced current produced in the key bottom receiving coils a5, b5, c5, and d5 over time, in response to the switch key top 401 being rotated.

In FIG. 10, from t0 to t3, key bottom receiving coil a5 has an induced current that is greater than or equal to threshold I. Then, from t4 to t7, key bottom receiving coil d5 has an induced current that is greater than or equal to threshold I, and from t8 to t11, key bottom receiving coil c5 has an induced current that is greater than or equal to threshold I. Accordingly, a determination is made that from t0 to t11, the switch key top 401 is rotated rightward by 180 degrees.

4. Variations

Further variations to the above-described Embodiments are possible, provided that these do not exceed the technical scope of the disclosure. Examples are listed below.

[1] The switch device of the above-described Embodiments is described as including a A/D converter and a determiner that determines a relative change in operating state of a switch key top by using a current value of induced current produced in a key bottom receiving coil and digitized by the A/D converter. However, the A/D converter may be omitted, and the determiner may instead use the analogue value of the induced current in the key bottom receiving coil as-is to determine the relative change in operating state of the switch key top.

[2] The switch device of the above-described Embodiments has receiving coils and transmitting coils printed on a substrate. However, other coils such as windings or stacks may also be used. In recent years, coil miniaturization technology has become widespread. For instance, stacked ceramic coils made using ferrite and microcoil windings are undergoing development. These may, of course, be applied to the present disclosure.

[3] In the switch device of the above-described Embodiments, the current supplier may not supply current to the key bottom transmitting coil when, for example, the terminal on which the switch device is installed is in sleep mode or locked mode. Accordingly, the supply of current is constrained according to the current mode of the terminal on which the switch device is installed, which reduces electric power consumption for the terminal.

[4] In the switch device of the above-described Embodiments, the current supplier uses a PLL, for example. However, no limitation to the PLL is intended. Various other types of current-producing circuits may also be used. The current supplied to the key bottom transmitting coil need not necessarily be a high-speed signal having a fixed period like PLL, but may also be any signal with a period that is equal to or less than half the determination interval.

[5] In the switch device 200 of Embodiment 1, described above, an individual determination is made regarding whether each the ends A, B, C, and D of the switch key top 201 is pressed. However, no such limitation is intended. The determiner may also make a general determination of whether the switch key top 201 is being pressed. For example, when induction voltage that is equal to or greater than threshold I occurs in key bottom receiving coil c3 immediately after induction voltage that is equal to or greater than threshold I occurs in key bottom receiving coil a3, a determination may be made such that end A has been pressed toward end C, on the switch key top 201.

[6] In Embodiment 2, described above, the switch device 200 is described as a directional pad. However, no such limitation is intended. The switch key top may have any of a variety of shapes. Furthermore, a determination may be made regarding pressing of the switch key top at any position.

[7] In Embodiment 2, described above, a single threshold I is used to make the pressing determination for each end A, B, C, and D of the switch key top 201. No such limitation is intended. The switch device 200 of Embodiment 2 may, like the switch device 100 of Embodiment 1, also use a plurality of thresholds to determine a plurality of pressing states according to the degree of pressing at each of the ends A, B, C, and D.

[8] In the switch device 400 of Embodiment 3, the switch key top and the switch key bottom are described as being used with a rotation operation with respect to a relative displacement. However, the switch key top may also be configured for a sliding operation and a determination may be made regarding whether or not the switch key top has been slid. Specifically, the switch key bottom may have a key bottom transmitting and receiving coil arranged over a slide operation line and determine the position of the key top transmitting coil according to induced current occurring in a key bottom receiving coil, thereby determining whether a slide operation is performed on the switch key top.

[9] In the switch device 400 of Embodiment 3, described above, the paired transmitting and receiving coils are provided as one pair on the switch key top and as four pairs on the switch key bottom. However, depending on the relative displacement operation performed on the switch key top and the switch key bottom, the paired transmitting and receiving coils may be provided in plurality on the switch key top while only one pair is provided on the switch key bottom.

[10] In the above-described Embodiments, a single switch key top is provided. However, no such limitation is intended. A plurality of switch key tops may be provided and a determination of relative displacement may be performed for each of the switch key tops. Furthermore, the relative displacement for each of the switch key tops need not be determined individually, but may be a general determination of switch operation made from a combination of current values in the switch key tops.

[11] The switch device of the above-described Embodiments may be installed in a variety of electronic terminals. For example, the switch device of the above-described Embodiments may be used as a home button in a smartphone or tablet terminal. Also, as shown in the example of FIG. 12, the switch device of the above-described Embodiments may be used as a shutter button 700-1 of a still camera, as a record or zoom button (700-2, 700-3) of a video camera, and so on.

5. Supplement

Configurations and effects of the switch device are presented below, as aspects of the disclosure.

(A) In one aspect, a switch device, comprises: a switch key top and a switch key bottom that are freely displaceable relative to each other, wherein the switch key top includes a key top receiving coil and a key top transmitting coil that are connected to each other, and the switch key bottom includes: a key bottom transmitting coil having a relative positional relationship with the key top receiving coil that changes according to a relative displacement operation with respect to the switch key top; a key bottom receiving coil having a relative positional relationship with the key top transmitting coil that changes according to the relative displacement operation with respect to the switch key top; a current supplier supplying current to the key bottom transmitting coil; and a determiner determining a relative displacement with respect to the switch key top, according to an induced current occurring in the key bottom receiving coil.

According to this configuration, the switch device of aspect (A) uses the effect of induced current to determine the operating state of the switch key top, without requiring any wiring that would impose a load according to the relative displacement of the switch key top and the switch key bottom. Thus, the switch device of aspect (A) presents a great increase in durability, and can easily be installed in a water-resistance terminal.

(B) In another aspect, the switch key bottom further includes an A/D converter digitizing a current value of the induced current, and the determiner compares the current value of the induced current digitized by the A/D converter to a threshold serving as a basis for determination to determine the relative displacement with respect to the switch key top.

According to this configuration, the switch device of aspect (B) is able to correctly determine the operating state of the switch key top.

(C) In a further aspect, the relative displacement operation is one of a pressing operation, a rotation operation, and a sliding operation.

(D) In yet another aspect, the threshold includes a first threshold value and a second threshold value that is larger than the first threshold value, and the determiner compares the current value to the first threshold value and to the second threshold value, and determines the relative displacement with respect to the switch key top according to an amount of pressing in the pressing operation.

According to this configuration, the switch device of aspect (D) is able to determine a plurality of pressing states according to an amount of pressing on the switch key top.

(E) In an additional aspect, the current supplier supplies the current to the key bottom transmitting coil when a terminal incorporating the switch device is in a standby state, and does not supply the current to the key bottom transmitting coil otherwise.

According to this configuration, the current supplier controls the supply of electricity according to a mode of the terminal, thereby achieving power consumption reduction.

(F) In another additional aspect, in the switch key bottom, the key bottom transmitting coil is provided in plurality, each of the key bottom transmitting coils having an individual relative positional relationship with the key top receiving coil that changes according to the relative displacement operation with respect to the switch key top, the key bottom receiving coil is provided in plurality, each of the key bottom receiving coils having an individual relative positional relationship with the key top transmitting coil that changes according to the relative displacement operation with respect to the switch key top, the current supplier supplies the current to each of the key bottom transmitting coils, and the determiner determines the relative displacement with respect to the switch key top according to the induced current occurring each of the key bottom receiving coils.

According to this configuration, the switch device of aspect (F) is able to determine more operating states.

(G) In a further additional aspect, in the switch key bottom, the key bottom transmitting coil is provided in plurality, each of the key bottom transmitting coils having an individual relative positional relationship with the key top receiving coil that changes according to the relative displacement operation with respect to the switch key top, the key bottom receiving coil is provided in plurality, each of the key bottom receiving coils having an individual relative positional relationship with the key top transmitting coil that changes according to the relative displacement operation with respect to the switch key top, the current supplier supplies the current to each of the key bottom transmitting coils, the A/D converter digitizes a respective current value of the induced current in each of the key bottom receiving coils, and the determiner compares the respective current value of the induced current in each of the key bottom receiving coils, digitized by the A/D converter, to the threshold serving as the basis for determination to determine the relative displacement with respect to the switch key top.

According to this configuration, the switch device of aspect (G) is able to correctly determine more operating states.

(H) In still another aspect, the relative displacement operation is a pressing operation, the key top receiving coil and the key top transmitting coil in the switch key top are connected to each other so as to be displaced by the pressing operation, in the switch key bottom, the relative positional relationship between the key bottom transmitting coil and the key top receiving coil changes according to the pressing operation, and the relative positional relationship between the key bottom receiving coil and the key top transmitting coil changes according to the pressing operation, the current supplier supplies the current to the key bottom transmitting coil, and the determiner determines the relative displacement with respect to the switch key top according to the induced current occurring in the key bottom receiving coil due to the pressing operation.

According to this configuration, the switch device of aspect (H) is able to determine a pressing state at various pressing positions of the switch key top, such as on a directional pad. Also, the switch device of aspect (H) is able to determine an overall pressing state of the switch key top by using a combination of key bottom receiving coils producing induced current, such as when the switch key top is pressed obliquely.

(I) In an alternative aspect, the key top receiving coil and the key top transmitting coil in the switch key top are connected to each other so as to be displaced by the pressing operation, in the switch key bottom, the key bottom transmitting coil is provided in plurality, each of the key bottom transmitting coils having an individual relative positional relationship with the key top receiving coil that changes according to the relative displacement operation with respect to the switch key top, the key bottom receiving coil is provided in plurality, each of the key bottom receiving coils having an individual relative positional relationship with the key top transmitting coil that changes according to the relative displacement operation with respect to the switch key top, the current supplier supplies the current to each of the key bottom transmitting coils, the A/D converter digitizes the respective current value of the induced current in each of the key bottom receiving coils, and the determiner compares each of the respective current values digitized by the A/D converter to the first threshold value and to the second threshold value to determine the relative displacement with respect to the switch key top.

According to this configuration, the switch device of aspect (I) is able to determine a pressing state according to the amount of pressing at various pressing positions of the switch key top, such as on a directional pad. Also, the switch device of aspect (1) is able to determine an overall pressing state of the switch key top by using a combination of key bottom receiving coils producing induced current, such as when the switch key top is pressed obliquely. Further, the switch device of aspect (1) is also able to determine the overall pressing state of the switch key top using a combination of induced current values produced in each of the key bottom receiving coils.

(J) In still a further additional aspect, the switch key top is provided in plurality, and the determiner determines the relative displacement with respect to each of the switch key tops.

According to this configuration, the switch device of aspect (J) not only determined individual operating states of each of a plurality of switch key tops, but also makes an overall determination for a plurality of a operating states of the switch device using a combination of key bottom receiving coils producing induction voltage, a combination of induced current values produced in each of the key bottom receiving coils, or both.

(K) In an aspect of an electronic terminal, the switch device of any of aspects (A) through (J), described above, may be used.

According to this configuration, the electronic terminal of aspect (K) is able to greatly improve switch durability.

INDUSTRIAL APPLICABILITY

The switch device of the present disclosure enables a great increase in durability by determining a pressing state of a switch key top using the effect of electromagnetic induction without requiring wiring that imposes a load according to the relative displacement between a switch key top and a switch key bottom. Thus, the switch device is applicable to terminals with high switch usage requiring high durability therefor.

REFERENCE SIGNS LIST

10 Mobile terminal
100, 200, 400 Switch device
101, 201, 401 Switch key top
102 Substrate
103 Key top receiving coil
104 Key top transmitting coil
105 Axial rod
105a, 208 Protrusion
106, 206, 406 Switch key bottom
107, 207, 407 Concavity
108 Key bottom transmitting coil
109 Key bottom receiving coil
111 Connection pattern
115, 415 Hole
115a Key groove
117, 217 Coil spring
120 Current supplier
130 A/D converter
140 Determiner
601 Switch key top
602 Coil A
603 Current production circuit
604 Coil B
605 Detection circuit
700-1, 700-2, 700-3 Switch device
a1, b1, c1, d1 Coil pattern
a2, b2, c2, d2, a4, b4, c4, d4 Key bottom transmitting coil
a3, b3, c3, d3, a5, b5, c5, d5 Key bottom receiving coil
s1 Key bottom transmitting coil
s2 Key bottom receiving coil

The invention claimed is:

1. A switch device, comprising:
a switch key top and a switch key bottom that are freely displaceable relative to each other, wherein
the switch key top includes a key top receiving coil and a key top transmitting coil that are connected to each other, and
the switch key bottom includes:
a key bottom transmitting coil having a relative positional relationship with the key top receiving coil that changes according to a relative displacement operation with respect to the switch key top;
a key bottom receiving coil having a relative positional relationship with the key top transmitting coil that changes according to the relative displacement operation with respect to the switch key top;
a current supplier supplying current to the key bottom transmitting coil; and
a determiner including a hardware processor that executes a program for determining a relative displacement with respect to the switch key top in terms of a current supply time interval of the current supplier, according to an induction current occurring in the key bottom receiving coil, wherein
the switch key bottom further includes an A/D converter digitizing a current value of the induction current
the determiner compares the current value of the induction current digitized by the A/D converter to a threshold serving as a basis for determination to determine the relative displacement with respect to the switch key top;
the threshold includes a first threshold value and a second threshold value that is larger than the first threshold value, and
the determiner compares the current value to the first threshold value and to the second threshold value, and determines the relative displacement with respect to the switch key top.

2. The switch device of claim 1, wherein
the relative displacement operation is one of a pressing operation, a rotation operation, and a sliding operation, and
the determiner determines the relative displacement with respect to the switch key top according to one of an amount of pressing in the pressing operation, an amount of displacement in the rotation operation, and an amount of displacement in the sliding operation.

3. The switch device of claim 1, wherein
the current supplier supplies the current to the key bottom transmitting coil when a terminal incorporating the switch device is in a standby state, and does not supply the current to the key bottom transmitting coil otherwise.

4. The switch device of claim 1, wherein
in the switch key bottom, the key bottom transmitting coil is provided in plurality, each of the key bottom transmitting coils having an individual relative positional relationship with the key top receiving coil that changes according to the relative displacement operation with respect to the switch key top,
the key bottom receiving coil is provided in plurality, each of the key bottom receiving coils having an individual relative positional relationship with the key top transmitting coil that changes according to the relative displacement operation with respect to the switch key top,
the current supplier supplies the current to each of the key bottom transmitting coils, and the determiner determines the relative displacement with respect to the switch key top according to the induction current occurring each of the key bottom receiving coils.

5. The switch device of claim 2, wherein
in the switch key bottom, the key bottom transmitting coil is provided in plurality, each of the key bottom transmitting coils having an individual relative positional relationship with the key top receiving coil that changes according to the relative displacement operation with respect to the switch key top,
the key bottom receiving coil is provided in plurality, each of the key bottom receiving coils having an individual relative positional relationship with the key top transmitting coil that changes according to the relative displacement operation with respect to the switch key top, the current supplier supplies the current to each of the key bottom transmitting coils, the A/D converter digitizes a respective current value of the induction current in each of the key bottom receiving coils, and
the determiner compares the respective current value of the induction current in each of the key bottom receiving coils, digitized by the A/D converter, to the threshold serving as the basis for determination to determine the relative displacement with respect to the switch key top.

6. The switch device of claim 3, wherein
in the switch key bottom, the key bottom transmitting coil is provided in plurality, each of the key bottom transmitting coils having an individual relative positional relationship with the key top receiving coil that changes according to the relative displacement operation with respect to the switch key top,
the key bottom receiving coil is provided in plurality, each of the key bottom receiving coils having an individual relative positional relationship with the key top transmitting coil that changes according to the relative displacement operation with respect to the switch key top, the current supplier supplies the current to each of the key bottom transmitting coils, the A/D converter digitizes the respective current value of the induction current in each of the key bottom receiving coils, and
the determiner compares each of the respective current values digitized by the A/D converter to the first threshold value and to the second threshold value to determine the relative displacement with respect to the switch key top.

7. The switch device of claim 4, wherein
the switch key top is provided in plurality, and
the determiner determines the relative displacement with respect to each of the switch key tops.

8. An electronic terminal, comprising
the switch device according to claim 1.

9. The switch device of claim 1, wherein
the relative displacement operation is a pressing operation, and the determiner determines that: (i) the switch key top is not pressed when the current value is less than the first threshold value; (ii) the switch key top is half pressed when the current value is greater than or equal to the first threshold value and lower than the second threshold value; and (iii) the switch key top is fully pressed when the digital value is greater than or equal to the second threshold value.

* * * * *